(12) United States Patent
Sofia et al.

(10) Patent No.: US 9,298,592 B2
(45) Date of Patent: Mar. 29, 2016

(54) TESTING A SOFTWARE INTERFACE FOR A STREAMING HARDWARE DEVICE

(71) Applicant: International Business Machines Corporation, Armonk, NY (US)

(72) Inventors: Anthony T. Sofia, Highland, NY (US); Peter B. Yocom, Lagrangeville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 141 days.

(21) Appl. No.: 13/803,717

(22) Filed: Mar. 14, 2013

(65) Prior Publication Data

US 2014/0282436 A1    Sep. 18, 2014

(51) Int. Cl.
*G06F 9/44* (2006.01)
*G06F 11/36* (2006.01)
*G06F 17/50* (2006.01)

(52) U.S. Cl.
CPC ........ *G06F 11/3672* (2013.01); *G06F 11/3692* (2013.01); *G06F 11/3696* (2013.01); *G06F 17/5009* (2013.01)

(58) Field of Classification Search
CPC . G06F 17/5022; G06F 11/261; G06F 11/263; G06F 11/3668; G06F 17/5009; G06F 11/3696; G06F 11/3692; G06F 11/3672
USPC ........................................................ 717/135
See application file for complete search history.

(56) References Cited

U.S. PATENT DOCUMENTS

| | | | |
|---|---|---|---|
| 6,985,940 | B1* | 1/2006 | Jenkin .......................... 709/224 |
| 7,721,260 | B2* | 5/2010 | Short et al. .................... 717/124 |

(Continued)

OTHER PUBLICATIONS

Aleen, et al., "Input-Driven Dynamic Execution Prediction of Streaming Applications"; Proceedings of the 15th ACM SIGPLAN Symposium on Principles and Practice of Parallel Programming; vol. 45; Issue 5; Mayb 2010; pp. 315-324.

(Continued)

*Primary Examiner* — Lewis A Bullock, Jr.
*Assistant Examiner* — Jacob Dascomb
(74) *Attorney, Agent, or Firm* — Cantor Colburn LLP; William A. Kinnaman, Jr.

(57) ABSTRACT

Embodiments of the disclosure relate to testing a software interface for a streaming hardware device through simulation. Methods include receiving, by a processor, a data manipulation request and a data segment associated with the data manipulation request and generating, by the software interface, an input data stream comprising control information and the data segment. The method also includes transmitting the input data stream to a simulation device and generating, by the simulation device, an output data stream in response to the input data stream, the output data stream including a delineator, control data, a manipulated data segment and a trailing delineator. The simulation device is configured to simulate the operation of the streaming hardware device by performing the data manipulation request.

6 Claims, 7 Drawing Sheets

(56) References Cited

U.S. PATENT DOCUMENTS

| | | | |
|---|---|---|---|
| 7,724,684 B2* | 5/2010 | Cassod et al. | 370/252 |
| 7,827,334 B2* | 11/2010 | Teggatz et al. | 710/105 |
| 8,024,620 B2* | 9/2011 | Moyer | 717/124 |
| 8,397,220 B1* | 3/2013 | Philipp et al. | 717/135 |
| 2005/0071791 A1 | 3/2005 | Buckley, Jr. | |
| 2005/0203720 A1 | 9/2005 | Lagoon et al. | |
| 2009/0172066 A1 | 7/2009 | Cornea-Hasegan | |
| 2009/0193296 A1 | 7/2009 | Kellington et al. | |
| 2011/0066416 A1* | 3/2011 | Sachs | 703/13 |
| 2012/0265515 A1 | 10/2012 | Weintraub | |

OTHER PUBLICATIONS

Hou, et al., "Efficient Data Streaming with On-Chip Accelerators: Opportunities and Challenges", HPCA '11 Proceedings of the 2011 IEEE 17th International Symposium on High Performance Computer Architecture, 2011; pp. 312-320.

Ononiwu, "A Language for Streams on Reconfigurable Many-Cores;" Journal: Academic Reserach International; ISSN 2223-9944; vol. 3; Issue 2; Sep. 2012; pp. 78-84.

* cited by examiner

| Control Info | Manipulated Data | Control Info | Manipulated Data | Control Info |

FIG. 3A

| Control Data | Delineator | Length | Application Data |

FIG. 3B

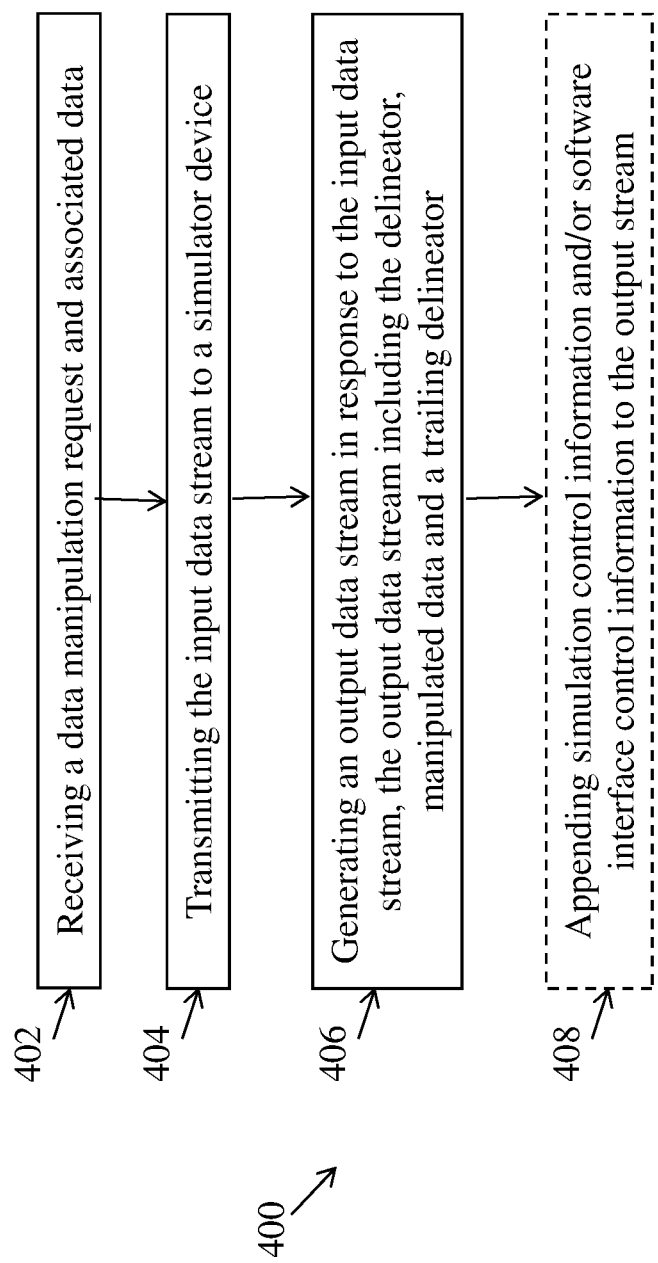

TESTING A SOFTWARE INTERFACE FOR A STREAMING HARDWARE DEVICE

BACKGROUND

The present invention relates to interfaces for hardware devices, and more specifically, to methods and systems for testing a software interface for a streaming hardware device through simulation.

Recently, the use of special purpose hardware devices for performing processor intensive functions has been increasing. These hardware devices may be used for data manipulation operations, such as data compression, encoding, or the like either in a single operation or in a streaming model where multiple requests are related. These streaming hardware devices, such as data manipulation devices, often have different performance attributes, such as speed and latency, than a general processor performing similar operations in pure software. For example, an increased overhead may be incurred in communicating with a streaming hardware device as compared with a general processor.

In general, in order for the streaming hardware devices to be used by a processor a software interface is required. The software interface allows the processor and applications to utilize the streaming hardware devices to perform processor intensive functions. As the use of streaming hardware devices for applications continues to increase, the software interfaces that will exploit these devices need to be tested.

SUMMARY

Embodiments include a computer system for testing a software interface for a streaming hardware device through simulation. The computer system includes a processor configured to execute a method including receiving, by a processor, a data manipulation request and a data segment associated with the data manipulation request and generating, by the software interface, an input data stream comprising control information and the data segment. The method also includes transmitting the input data stream to a simulation device and generating, by the simulation device, an output data stream in response to the input data stream, the output data stream including a delineator, control data, a manipulated data segment and a trailing delineator. The simulation device is configured to simulate the operation of the streaming hardware device by performing the data manipulation request.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 3A illustrates a block diagram of a data stream between a streaming hardware device and a software interface in accordance with an exemplary embodiment;

FIG. 3B illustrates a block diagram of a data stream between a simulation device and a software interface in accordance with an exemplary embodiment;

FIG. 4 illustrates a flow diagram of a method for testing a software interface for a streaming hardware device through simulation in accordance with an exemplary embodiment.

DETAILED DESCRIPTION

In accordance with exemplary embodiments, a software interface is configured to facilitate interaction between a processor and a streaming hardware device. The software interface permits the streaming hardware device to be transparently integrated into a computer system and to perform processing for existing workloads and applications. In order to minimize the development time of both the software interface and the streaming hardware device, testing of the software interface may be performed through simulation while the development of the streaming hardware device is underway. In exemplary embodiments, simulation of a streaming hardware device provides a similar set of functions as the streaming hardware device and manipulates test data in a way where automated test cases can validate that the data generated by the software interface is correct.

Figure 1:
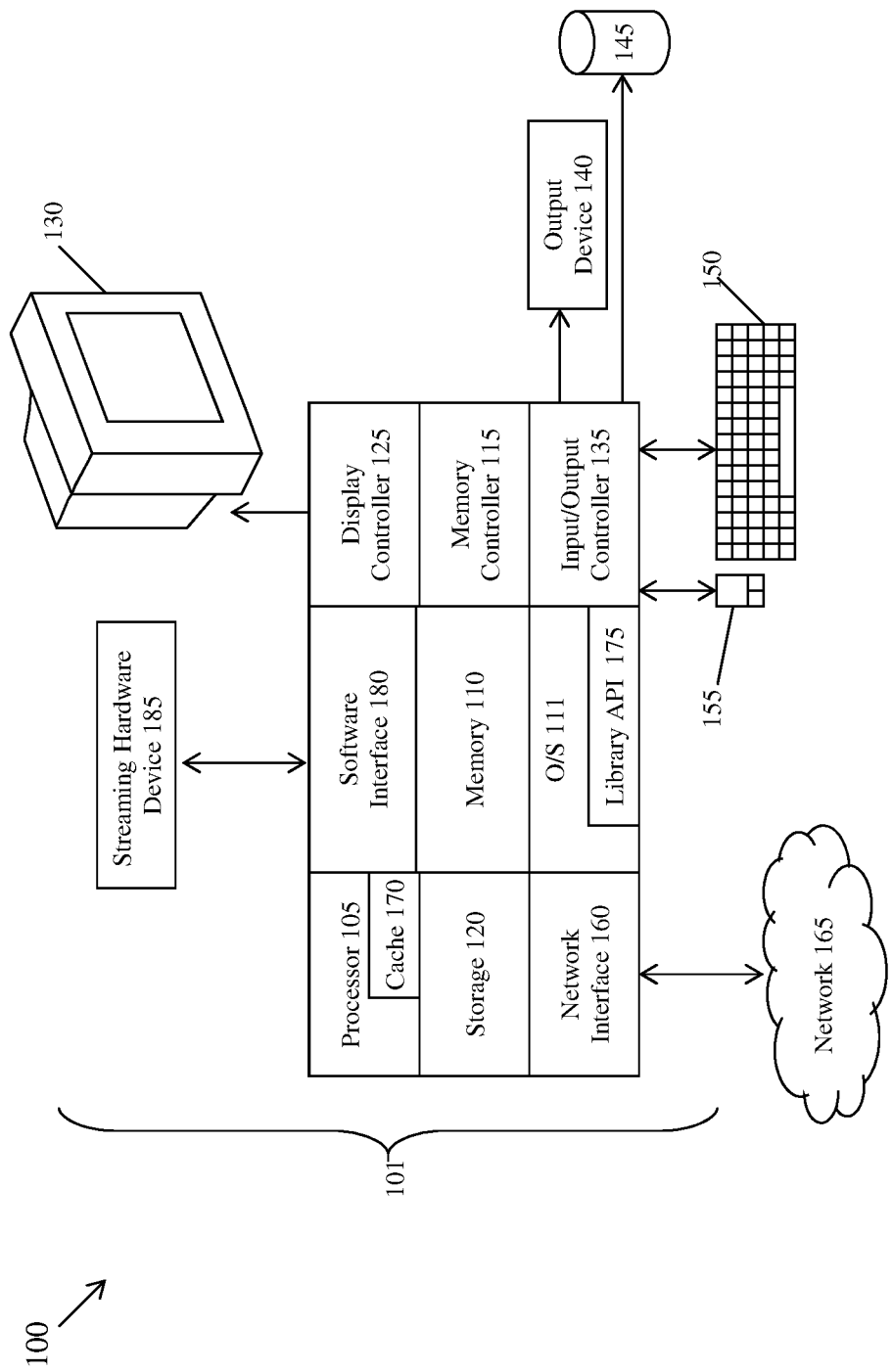
FIG. 1 illustrates a block diagram of a computer system for use in practicing the teachings herein.

FIG. 1 illustrates a block diagram of a computer system 100 for use in practicing the teachings herein. The methods described herein can be implemented in hardware, software (e.g., firmware), or a combination thereof. In an exemplary embodiment, the methods described herein are implemented in hardware, and may be part of the microprocessor of a special or general-purpose digital computer, such as a personal computer, workstation, minicomputer, or mainframe computer. The computer system 100 therefore includes general-purpose computer 101.

In an exemplary embodiment, in terms of hardware architecture, as shown in FIG. 1, the computer 101 includes a processor 105, memory 110 coupled to a memory controller 115, and one or more input and/or output (I/O) devices 140, 145 (or peripherals) that are communicatively coupled via a local input/output controller 135. The input/output controller 135 can be, for example but not limited to, one or more buses or other wired or wireless connections, as is known in the art. The input/output controller 135 may have additional elements, which are omitted for simplicity, such as controllers, buffers (caches), drivers, repeaters, and receivers, to enable communications. Further, the local interface may include address, control, and/or data connections to enable appropriate communications among the aforementioned components.

The processor 105 is a hardware device for executing hardware instructions or software, particularly that stored in memory 110. The processor 105 can be any custom made or commercially available processor, a central processing unit (CPU), an auxiliary processor among several processors associated with the computer 101, a semiconductor based microprocessor (in the form of a microchip or chip set), a macro processor, or generally any device for executing instructions. The processor 105 includes a cache 170, which may include, but is not limited to, an instruction cache to speed up executable instruction fetch, a data cache to speed up data fetch and store, and a translation lookaside buffer (TLB) used to speed up virtual-to-physical address translation for both executable instructions and data. The cache 170 may be organized as a hierarchy of more cache levels (L1, L2, etc.).

The memory 110 can include any one or combination of volatile memory elements (e.g., random access memory (RAM, such as DRAM, SRAM, SDRAM, etc.)) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 110 may incorporate electronic, magnetic, optical, and/or other types of storage media. Note that the memory 110 can have a distributed architecture, where various components are situated remote from one another, but can be accessed by the processor 105.

The instructions in memory 110 may include one or more separate programs, each of which comprises an ordered listing of executable instructions for implementing logical functions. In the example of FIG. 1, the instructions in the memory 110 include a suitable operating system (OS) 111. The operating system 111 essentially controls the execution of other computer programs and provides scheduling, input-output control, file and data management, memory management, and communication control and related services.

In an exemplary embodiment, a conventional keyboard 150 and mouse 155 can be coupled to the input/output controller 135. Other output devices such as the I/O devices 140, 145 may include input devices, for example but not limited to a printer, a scanner, microphone, and the like. Finally, the I/O devices 140, 145 may further include devices that communicate both inputs and outputs, for instance but not limited to, a network interface card (NIC) or modulator/demodulator (for accessing other files, devices, systems, or a network), a radio frequency (RF) or other transceiver, a telephonic interface, a bridge, a router, and the like. The system 100 can further include a display controller 125 coupled to a display 130. In an exemplary embodiment, the system 100 can further include a network interface 160 for coupling to a network 165. The network 165 can be an IP-based network for communication between the computer 101 and any external server, client and the like via a broadband connection. The network 165 transmits and receives data between the computer 101 and external systems. In an exemplary embodiment, network 165 can be a managed IP network administered by a service provider. The network 165 may be implemented in a wireless fashion, e.g., using wireless protocols and technologies, such as WiFi, WiMax, etc. The network 165 can also be a packet-switched network such as a local area network, wide area network, metropolitan area network, Internet network, or other similar type of network environment. The network 165 may be a fixed wireless network, a wireless local area network (LAN), a wireless wide area network (WAN) a personal area network (PAN), a virtual private network (VPN), intranet or other suitable network system and includes equipment for receiving and transmitting signals.

If the computer 101 is a PC, workstation, intelligent device or the like, the instructions in the memory 110 may further include a basic input output system (BIOS) (omitted for simplicity). The BIOS is a set of essential routines that initialize and test hardware at startup, start the OS 111, and support the transfer of data among the hardware devices. The BIOS is stored in ROM so that the BIOS can be executed when the computer 101 is activated. When the computer 101 is in operation, the processor 105 is configured to execute instructions stored within the memory 110, to communicate data to and from the memory 110, and to generally control operations of the computer 101 pursuant to the instructions.

In exemplary embodiments, the computer 101 further includes a software interface 180 that is configured to communicate with a streaming hardware device 185. The streaming hardware device 185 is a device configured to perform a data manipulation function, which can be any algorithm that manipulates input data into a defined format of output data. In exemplary embodiments, the data manipulation function may increase or decrease the size of the input data. For example, the data manipulation function may be configured to compress or decompress data. In exemplary embodiments, the operating system 111 includes a library API 175, which is a software library comprising APIs for performing the data manipulation functions provided by the streaming hardware devices 185.

In exemplary embodiments, the library API 175 is configured to determine if a request for a data manipulation function will be executed by a software API or by the streaming hardware device 185. The library API 175 may make this determination based on the size of the data to be manipulated, the availability of the streaming hardware device 185 and characteristics of the streaming hardware device 185. In exemplary embodiments, the availability and characteristics of the streaming hardware device 185 can be provided to the library API 175 by the software interface 180. For example, the software interface 180 may provide the library API 175 with a suggested minimum data size for the use of the streaming hardware device 185 based on the overhead associated with using the streaming hardware device 185.

In exemplary embodiments, the software interface 180 is configured to provide buffering support for data manipulation requests received from and responses sent to the library API 175. In exemplary embodiments, the software interface 180 can also provide fail-over processing in the event of a failure of the streaming hardware device 185.

In exemplary embodiments, the software interface 180 may be configured to determine if data manipulation requests received from the library API 175 are viable to be sent to streaming hardware device 185. The viability of a data manipulation request can be based on determining if the overhead of performing the setup for sending the operation to the streaming hardware devices 185 outweighs the cost of doing the operation itself. If this goal can not be reached it would be more efficient to perform the data manipulation request using the software API equivalent to the streaming hardware device 185. In exemplary embodiments, the software interface 180 provides the library API 175 with a minimum threshold size that represents the lower bound size of viability for a data manipulation request.

In exemplary embodiments, the streaming hardware device 185 is configured manipulate input data such that the when the output of the request is provided as input the original input data is generated (i.e., the operation of the streaming hardware device 185 is reversible). The software interface gives the streaming hardware device 185 both the data to manipulated and control data. The control data is used to help restore the original data at the point in time when the data manipulation is reversed. A complete stream of data manipulated by the streaming hardware device 185 is shown in FIG. 3A.

Both the control data and the manipulated data are bits strings that may not be byte aligned. Because the streaming hardware device 185 can only put full bytes in the output stream, when the streaming hardware device 185 completes a request, the last bits it produced may not make up a full byte. These bits are returned as extra data to the software interface 180. One the next request from the library API 175, the software interface 180 appends any new control data to the extra data from the last request. If the results of appending the new control data and the extra data from the last request is less than a byte in length, the results are passed to the streaming hardware device 185 in a parameter call insert_bits. If the result is longer than 1 byte, the software interface 180 directly puts the full bytes in the output stream and passes any bits beyond the last full byte to the streaming hardware device 185 in a parameter called insert_bits.

In exemplary embodiments, the streaming hardware device 185 may be configured to partially process input data and provide partial output based on that subset of input data by saving state information that can be restored on subsequent calls.

Figure 2:
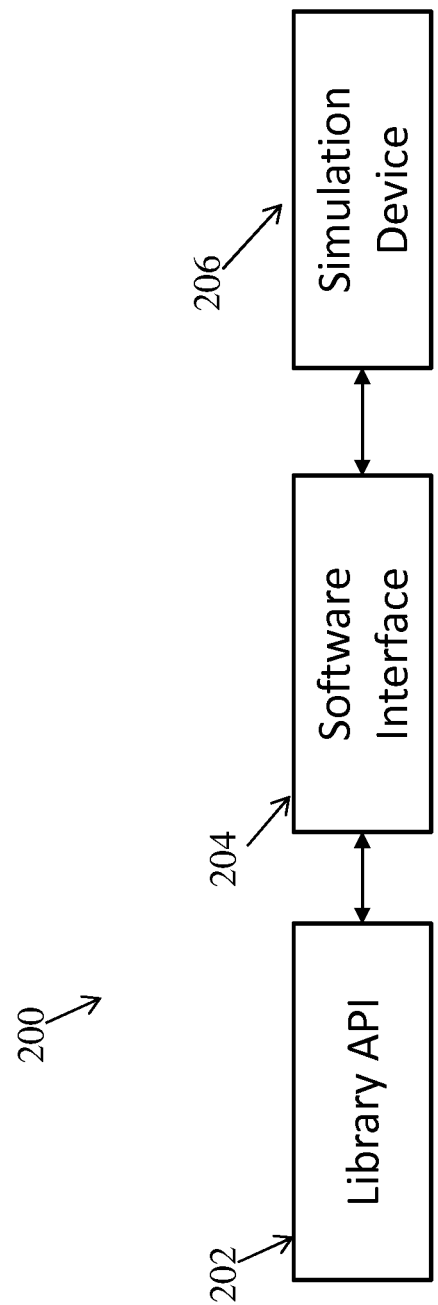
FIG. 2 illustrates a block diagram of a system for testing a software interface for a streaming hardware device in accordance with an exemplary embodiment.

Referring now to FIG. 2, a block diagram illustrating a system 200 for testing a software interface 204 for use with a streaming hardware device in accordance with an exemplary embodiment is shown. As illustrated, the system 200 includes a library API 202, a software interface 204 and a simulation device 206. In exemplary embodiments, the library API 202 is configured to receive a request from an application to perform a data manipulation function and to pass the request to an appropriate software interface 204. The software interface 204 is configured to interface with a simulation device 206, which is configured to simulate the operation of a streaming hardware device by operating on a bit stream received from the software interface 204.

In exemplary embodiments, the simulation device 206 is designed to present the same interface to the software interface 204 as the streaming hardware device would. The software interface 204 functions the same way when calling the simulation device 206 as it would when calling the streaming hardware device. The fact that use of the simulation device 206 is transparent to the software interface 204, allows the simulation device 206 to be used to test that the software interface is properly interacting with a real streaming hardware device.

In exemplary embodiments, the simulation device 206 is configured to manipulate input data in such a way that automated test cases can be used to determine that software interface 204 has correctly injected control information into the data stream provided to the simulation device 206. In addition, the simulation device 206 may be configured to perform checks to insure that the software interface 204 is providing the correct data to the simulation device 206 during the processing data.

In exemplary embodiments, the simulation device 206 includes data manipulation logic that is configured to allow injection of control data by the software interface 204. In one embodiment, the simulation device 206 may designate a delineator that is used to delineate data to be manipulated from control data. In exemplary embodiments, the delineator may be a value less than eight bits.

When software interface 204 calls the simulation device 206 for the first request in a stream, it will pass the application data for the request, the length of the application data for the request, and control data in the insert_bits parameter. In response, the simulation device 206 will generate an output stream as shown in FIG. 3B.

When the simulation device 206 returns data to the software interface 204, the simulation device 206 passes the delineator back to the software interface 204 as extra data. The software interface 204 is unaware that a delineator has been returned in the extra data and it processes the extra data as if it was interfacing with a real streaming hardware device. For each request received, the software interface decides whether or not to add control data to the data stream.

Figure 3C:
FIG. 3C illustrates a block diagram of a data stream between a simulation device and a software interface in accordance with an exemplary embodiment.

In cases where the software interface 204 does not add additional control data to the stream received from the simulation device 206. In the next request from the library API 202, the software interface 204 will pass the extra data returned from the previous request in the insert_bits parameter for the new request. Additionally, the software interface 204 will pass the application data and the length of the application data. The results of the simulation device 206 processing the request will be an output stream as shown in FIG. 3C. As shown in FIG. 3C, the delineator is added to the output stream since it was passed to the simulation device 206 in the inserts bits parameter.

Figure 3D:
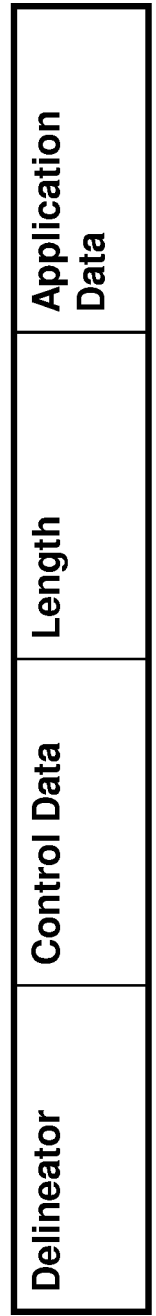
FIG. 3D illustrates a block diagram of a data stream between a simulation device and a software interface in accordance with an exemplary embodiment.

In cases where the software interface 204 does need to add control data to the stream to the stream received from the simulation device 206. The software interface 204 will append the extra data returned from the simulation device 206 to the new control data. The software interface 204 will then add the full bytes, if any, resulting from this append to the output stream, which results in an output stream as shown in FIG. 3D. As shown in FIG. 3D, the delineator is added to the output stream since it was contained in the extra data returned from the simulation device 206.

Figure 3E:
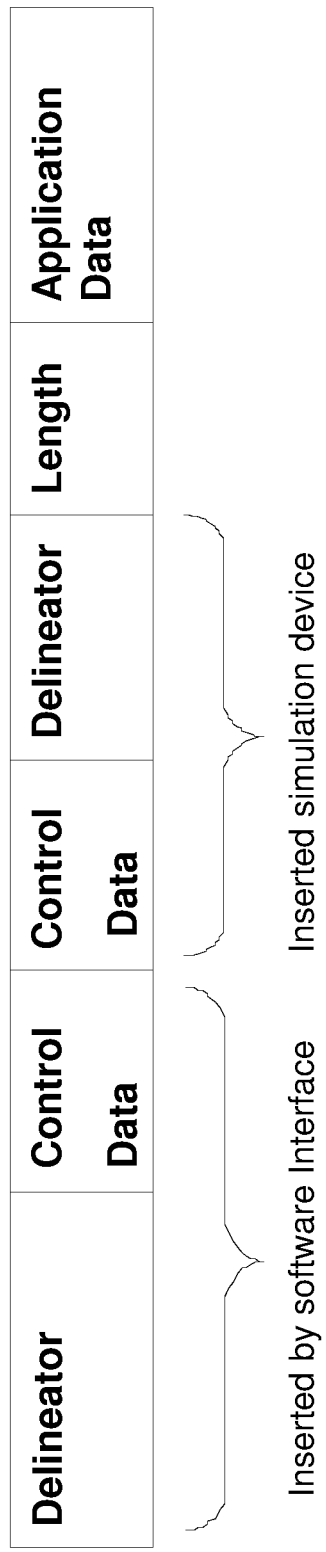
FIG. 3E illustrates a block diagram of a data stream between a simulation device and a software interface in accordance with an exemplary embodiment.

In exemplary embodiments, the delineator and the beginning of the control data may share a byte and any bits beyond the last full byte written to the output stream are kept until the next request from the library API 202. When the library API 202 calls the software interface 204 for the next request, the software interface 204 passes the remaining bits from the last request in the insert_bits parameter to the simulation device 204. These remaining bits contain the last piece of control data. Additionally, the new application data and its length are passed to the simulation device 204. As a result of the processing of both the software interface 202 and the simulation device 204, an output stream as shown in FIG. 3E is provided.

The simulation device 204 inserts the piece of control data that was passed to it in the insert_bits field. Because the insert_bits field was not equal to the delineator, it then inserts a delineator. Finally it inserts the length of the application data and the application data.

In exemplary embodiments, since the application data and the control data is segregated with the delineators test applications can post-process the output stream to insure that control information injected by the software interface is correct.

Referring now to FIG. 4, a flow diagram illustrating a method 400 for testing a software interface for a streaming hardware device through simulation is shown. As shown at block 402, the method 400 includes receiving a data manipulation request and associated data. Next, as shown at block 404, the method 400 includes transmitting the input data stream to a simulation device. As shown at block 406, the method 400 includes generating an output data stream in response to the input data stream, the output data stream including the delineator, manipulated data and a trailing delineator. In exemplary embodiments, the method 400 may include appending control information and/or software interface control information to the output stream, as shown at block 408.

In exemplary embodiments, the output data stream may not include enough information to restore a segment of manipulated data, which may impact the ability to perform processing to verify the proper operation of the software interface. Accordingly, the simulation device may be configured to save state information between calls from the software interface.

In exemplary embodiments, the simulation device is also configured to receive an output data stream of the simulation device and to generate an input data stream that would have created the output data stream.

Figure 5:
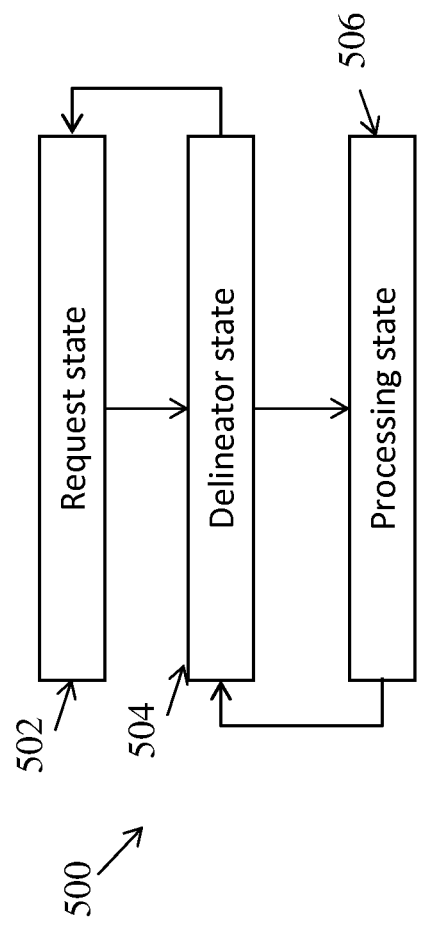
FIG. 5 illustrates a state diagram illustrating the operation of a simulation device in accordance with an exemplary embodiment.

Referring now to FIG. 5, a state diagram illustrating the operation of a simulation device is shown. As illustrated, the simulation device can operate in a plurality of states including, a request state 502, a delineator state 504 or a processing state 506. In the request state 502, the simulation device is awaiting a request from a software interface. Once the simulation device receives a request, and associated data, from a software interface, the simulation device will verify that the request is valid and proceed to the delineator state 504. In the delineator state 504, the simulation device will determine the appropriate delineator and then proceed to the processing state 506. At the processing state 506, the simulation device processes the next byte of data and determines if the byte of data is equal to the delineator. If the byte of data is equal to the delineator, the simulation device returns to the delineator state 504. Otherwise, the byte is processed, a bytes processed variable is incremented, and the simulation device stays in the processing state 506 and continues by processing the next byte. If during the delineator state 504, the simulation device determines that then end of the data block has been reached, the simulation device returns to the request state 502. In exemplary embodiments, the simulation device may determine that the end of the data block has been reached by comparing the bytes processed variable with a length variable that is indicative of the number of bytes to be processed by the request.

In exemplary embodiments, if the end of the data is reached during the processing state 506 the total length of the data and current length, or number of bytes processed, are saved along with an indication that end of the data was reached in the processing state 506. In exemplary embodiment, as delineators indicating the end of a data segment are encountered the bytes processed count will be validated against the segment length to insure that all data is accounted for during the restoration.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A computer system for testing a software interface for a streaming hardware device through simulation, the computer system comprising:
    a processor that performs a method comprising:
        receiving a data manipulation request and a data segment associated with the data manipulation request;
        generating, by the software interface, an input data stream comprising control information and the data segment, wherein the input data stream includes a length field and a delineator, wherein the length field consists of the size of the data segment associated with the data manipulation request;
        transmitting the input data stream to a simulation device;
        saving state information between calls from the software interface, wherein the state information is saved by the simulation device;
        generating, by the simulation device, an output data stream in response to the input data stream, by inserting a second delineator, a second control data, and a manipulated data segment, wherein the manipulated data segment and the control data are separated by the second delineator;
        storing the output data stream, by the simulation device, wherein the simulation device simulates the operation of the streaming hardware device by performing the data manipulation request; and
        verifying whether the software interface functions properly, by performing the steps of:
            transmitting the output data stream to a simulation device;
            processing the output stream by a test application to insure, using automated test cases, that the software interface has correctly inserted the control data into the output data stream;
            further in response to receiving the output data stream, generating, by the simulation device, a restored data segment based on the inserted second control data and saved state information; and
            determining whether the restored data segment is identical to the data segment to thereby indicate the proper operation of the software interface.

2. The computer system of claim 1, further comprising appending software interface control information to the output stream.

3. The computer system of claim 1, wherein the output data stream includes the control information.

4. The computer system of claim 1, wherein the control information is a series of bits that will not impact the data segment of the input data stream or output data stream.

5. The computer system of claim 1, wherein the simulation device is configured to process a portion of the input data stream and to generate a partial output data stream based on the portion of the input data stream and to save state information that can be restored on subsequent calls to the simulation device.

6. The computer system of claim 1, wherein the simulation device is configured save state information between calls from the software interface, wherein the state information can be used by the test application to insure that the software interface has correctly inserted the control data into the output data stream.

* * * * *